(12) United States Patent
Rivers et al.

(10) Patent No.: US 7,368,207 B2
(45) Date of Patent: May 6, 2008

(54) DYNAMIC COMPENSATION SYSTEM FOR MASKLESS LITHOGRAPHY

(75) Inventors: Andrea S. Rivers, Bloomfield, NY (US); Timothy J. Tredwell, Fairport, NY (US); Robert H. Cuffney, Honeoye Falls, NY (US); James T. Stoops, Walworth, NY (US); Joshua M. Cobb, Victor, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/396,167

(22) Filed: Mar. 31, 2006

(65) Prior Publication Data

US 2007/0231717 A1    Oct. 4, 2007

(51) Int. Cl.
*G03F 9/00* (2006.01)
*G03C 5/00* (2006.01)
(52) U.S. Cl. .................. 430/22; 430/30; 430/312
(58) Field of Classification Search .......... 430/22, 430/30, 312
See application file for complete search history.

(56) References Cited

U.S. PATENT DOCUMENTS

| 5,406,541 | A | 4/1995 | Kay |
|---|---|---|---|
| 5,521,748 | A | 5/1996 | Sarraf et al. |
| 6,251,550 | B1 | 6/2001 | Ishikawa |
| 2006/0033902 | A1 | 2/2006 | Latypov et al. |

FOREIGN PATENT DOCUMENTS

| EP | 1 482 373 | 12/2004 |
|---|---|---|
| JP | 7-283110 | 10/1995 |

OTHER PUBLICATIONS

Monk et al.; Digital micromirror device for projection display; SPIE vol. 2407, pp. 90-95.
Kuck et al.; Deformable Micromirror Devices as Phase Modulating High Resolution Light Valves; Transducers 95, pp. 301-304.

*Primary Examiner*—Christopher G. Young
(74) *Attorney, Agent, or Firm*—Nelson Adrian Blish (57) ABSTRACT

A method for dynamically registering multiple patterned layers on a substrate (3) comprises: depositing a first layer on the substrate; printing a first pattern (20) on the first layer; depositing a second layer on the first pattern; and printing a second pattern on the second layer while dynamically detecting the first pattern to align the second pattern with the first pattern.

22 Claims, 12 Drawing Sheets

DYNAMIC COMPENSATION SYSTEM FOR MASKLESS LITHOGRAPHY

FIELD OF THE INVENTION

This invention relates in general to printing patterns on a substrate and in particular, to printing multiple patterns on a substrate while dynamically aligning the patterns.

BACKGROUND OF THE INVENTION

Lithography was introduced to the electronics industry in the 1950's. The first integrated circuit was produced in 1960 by the firms Fairchild Semiconductor and Texas Instruments. Lithographic processes are used in both back plane and front plane display manufacturing. During the past 10 years, lithographic processes have been applied to new areas of precision patterning such as patterned synthesis of nucleic acid structures required for DNA testing.

In 1990 M. Rieger et al. described the value associated with direct write lithography, or maskless lithography. It has been broadly claimed that the elimination of masks will reduce process cost, increase process yield and enable the use of larger substrates. The use of laser patterning and light modulation to provide the ability to selectively pattern at high resolution is widely understood. U.S. Pat. No. 5,521,748 (Sarraf et al.) describes a light modulator for use with a laser or laser diode array such that the light from the laser is imaged on a light modulator having a row of light modulating elements, of either the reflectance or transmittance type. The light modulator is imaged onto light-sensitive materials and the image is scanned line by line on the light-sensitive materials. Control circuitry is provided to control the relative movement between the light modulator and the light-sensitive materials that may be either in planar form or wrapped around the circumference of a cylindrical drum.

Area based SLM have been described by Monk (The Digital Micro-mirror Device for Projection Display) in 1995. H. Kuck discloses the use area based spatial light modulators, lasers, optics and precision motion systems for the use in maskless lithographic systems in May of 1995. Kuck demonstrated the ability to produce sub micron features using this technique, but points out that to make this advantageous in the semiconductor industry one would need to increase the size of the SLMs and utilize precision air bearing motion systems. Hence the concept of utilizing lasers and spatial light modulators in direct write systems to eliminate the use of mask is clearly seen as advantageous.

There are, however, challenges that remain to be addressed to truly enable the process of maskless lithography on large substrates. Laser patterning will impart thermal energy to a substrate. The use of increasingly large linear or area array modulation only shifts the challenges of large mask production to the production of large lens arrays or large modulation assemblies. To minimize the manufacturing costs overall, one will need to utilize modulation with the appropriate number of channels. To meet the task time requirements, one may need to use parallel arrays, each at the appropriate number of channels. This application requires a shift in thinking away from the massively parallel model, which approximates large area masked processes. As this shift occurs, then one is faced with challenges involving time and space. First, time will elapse during the patterning process. Given that time, longer than that of a flash exposure, elapses, one must include in the challenges that of the dimensional stability of the substrate and the patterning mechanism, and in turn the dimensional relationship between the substrate and the patterning, light beam(s). The second challenge involves the spatial relationship of the multiple spatial light modulators or printhead assemblies with one another as well as the spatial relationship between these assemblies and the substrate.

Current fabrication processes operate on Gen VIII sized glass substrates. The industry agrees that this is either at or close to the limit for substrate size. Moving beyond this size prompts discussion of patterning on flexible support and possibly manufacturing in web based processes.

U.S. Pat. No. 6,251,550 (Ishikawa) describes a maskless lithography system, which utilizes an area exposure system. He mentions both LCD displays used as electronic masks and micro-mirror devices. It is advantaged in that the traditional alignment step involving a lateral shift of a mask can occur through electronic means. The traditional shifting of a mask in X and or Y may be seen as a global alignment process. As the display industry moves to fabrication on larger substrates and flexible support there is a need for a means of dynamically detecting and compensating for local changes in the registration of the patterning channels with patterns on the substrate in process.

SUMMARY OF THE INVENTION

Briefly, according to one aspect of the present invention a method for dynamically registering multiple patterned layers on a substrate comprises: depositing a first layer on the substrate; printing a first pattern on the first layer; depositing a second layer on the first pattern; and printing a second pattern on the second layer while dynamically detecting the first pattern to align the second pattern with the first pattern.

The advantages of the invention heretofore described include the ability to coordinate multiple printheads, the ability to track dimensional changes such as that due to thermally induced distortion of the substrate and/or the printhead, dimensional shifts such as that due to the hop and weave of a web during transport, or the misregistration of a printhead to a substrate due to abbé offsets contributed by the structure of the patterning motion system.

According to the invention, corrections of the location of the written spot are altered in both X and Y dimensions across the substrate image plane, resulting in improvements in the registration of one layer of patterning to a subsequent layer of patterning.

According to a further aspect of the invention, the system utilizes information about the prior patterning layers to enable precision detection at high speed of the relative location of the printhead and the substrate pattern.

According to a further aspect of the invention, the system affords the capability of recognizing errors in patterning, which may be used to prompt corrective actions in an automated manner.

According to a further aspect of the invention, this system employs a laser source, a means of modulating the light from the laser source, a means of altering the location of the modulated laser light in two dimensions so as to alter the written spot location.

According to a further aspect of the invention, the system utilizes a high-speed detection system to gather data, which in combination with position information and substrate content data allows the system to determine the alignment error.

The invention and its objects and advantages will become more apparent in the detailed description of the preferred embodiment presented below.

DETAILED DESCRIPTION OF THE INVENTION

The present invention is closed loop control system, which acts to align a second pattern that is being generated with a first pattern. The closed loop system operates dynamically, meaning that it operates during and integral with the pattern forming process. As a result, no additional alignment overhead is required.

Figure 1:
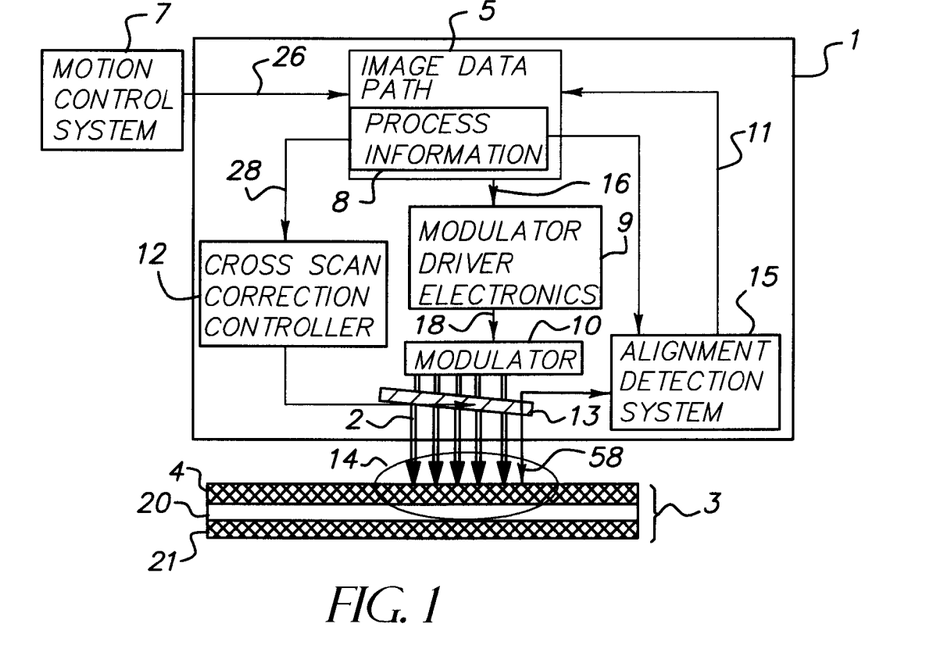
FIG. 1 is a schematic of a printing system according to the present invention.

Various pattern forming means exist that are compatible with this invention. The preferred embodiment describes a process whereby a substrate having a patterned first layer is coated with sensitive materials 4, as shown in FIG. 1. A pattern is formed in this second coated layer. One means of forming this pattern is through laser ablation. Alternately, the pattern can be formed through modification of a material coupled with a subsequent step. For example, one could sinter a material and wash off the not sintered components of the second layer. Or, one could polymerize a material and wash off the non-polymerized components of the second layer.

In addition, pattern formation approaches that are additive are also compatible with this invention. Rather than applying a second layer that is to be patterned, one can apply the pattern directly. Suitable additive processes include ink jet, gravure and laser thermal transfer.

Finally, when considering the various pattern forming approaches, combinations of the subtractive and additive techniques may be used. Since the ability to locate a patterned feature, for example, by ink jet may not meet the applications requirements, one can pattern by ink jet and then trim by ablation.

The operation of the preferred embodiment is consistent with any of the aforementioned pattern forming approaches. The system components are described below and shown in FIG. 1. Both the second pattern (not shown) and the first pattern 20 are generated via a maskless lithographic process using a multi-channel laser printhead 1 which imparts patterns of light 2 onto a substrate 3. Substrate 3 includes a support 21, a first pattern 20 and sensitive materials 4 which are sensitive to the wavelength or range of wavelengths of the patterning light from the multi-channel printhead.

The patterns of light are emitted from the modulator 10, which receives drive signals 18 from the modulator driver electronics 9. The modulator driver electronics 9 receives image data 16 from electronics called the image data path 5.

Image data 16 is representative of the second pattern that is to be produced in register to that of the first pattern 20. The image data path 5 has several functions. It is responsible for gating image data 16 to the modulator driver electronics 9. It is also responsible for determining when to gate this data to the modulator driver electronics 9. Finally, it computes and sends a cross-scan control signal 28 to the cross-scan correction controller 12. The image data path 5 monitors the current region 14 of the substrate 3 as detected by the alignment detection system 15. The current region 14 is defined as the area of the substrate 3, which is just about to be patterned. The alignment detection system 15 captures an electrical signal, which indicates the changes in reflectivity of the surface as the multi-channel laser printhead 1 and substrate 3 move relative to one another. The image data path 5 also processes the current motion control system position 26 provided by the motion control system 7 and the pending image data 16. The current position acts as a region of interest indicator and can be used as an enable signal to filter out spurious noise.

Once in the region of interest the detection of features on the substrate 3 triggers a synchronization signal. Based upon this information, the image data path 5 adjusts the gating of the pending image data 16 to the modulator driver electronics 9. The adjustment of the gating of the data is referred to as in-scan control. Cross-scan control is adjusted in this system by the cross-scan controller 12. The image data path 5 computes the misalignment between the pending image data 16 for the current motion control system position 26 and the current region 14 to generate an error signal that represents the correction that needs to be applied in order to counter the misalignment in the cross-scan direction. The image data path 5 sends the cross-scan control signal 28 to the cross-scan controller 12.

The image data path 5 has information that exists within the image file which details process information 8. This process information 8 is critically important in interpreting the output from the alignment detection system. Further, the image data path can send process information 8 to the alignment detection system, prompting adjustment of illumination wavelengths, magnitude, gain of electronic circuitry and the like, in order to optimize the detection process for a specific layer or combination of layers on a substrate 3. Process information 8 includes information such as the characteristics of the coated materials, which have been placed on the substrate 3, as well as information concerning the first pattern 20 on the substrate 3, which is currently expected to be within the view of the alignment detection system 15. Further, the process information 8 can include information concerning the complex topology formed by multiple first patterns that are superimposed upon one another.

The modulator 10 is responsible for altering the pattern of light 2 that is emitted from the multi-channel laser printhead 1. A wide array of modulation modalities is known in the art. In general one may divide these into reflective/diffractive and transmissive and would include TIR and DMD devices for example. In all cases control of the individual channels is possible through appropriate modulator driver electronics.

The comparative process described above is a spatially intermittent process. There will typically be specific areas within a pattern that will best lend themselves to processing. These are referred to as capture windows. These areas may be parts of the functional pattern of the device that is being manufactured, or they may be additional alignment marks. The location of these areas may be predefined. When they are predefined, data identifying their location is embedded in the process information 8. As the image data path 5 transfers the image data 16 to the modulator driver board 9, the image data path 5 recognizes the process information 8 that indicates that the system is approaching or is in a capture window. In this embodiment, the image data path 5 uses this information to trigger the comparative process. Alternately, when the image data path 5 recognizes the process information 8 the image data path 5 could send a signal to the alignment detection system 15 to trigger the detection process. Alignment correction refers to shifting of alignment in the cross-scan and in-scan directions. In-scan correction is accomplished through timing correction. In this specific embodiment the cross-scan correction is accomplished by sending a cross-scan control signal 28 to the cross-scan correction controller 12 to rotate an optical element 13 such that due to refraction the pattern emitted by the printhead is offset by a known amount in the cross-scan direction. Note that the alignment detection system 15 transmits the sensing and detecting beam 58 through the optical element 13 such that the movement of the optical element 13 will impact the alignment detection system 15 sensing. Also in this specific embodiment, the in-scan correction is accomplished by the image data path 5 through changes in head load timing.

Figure 2:
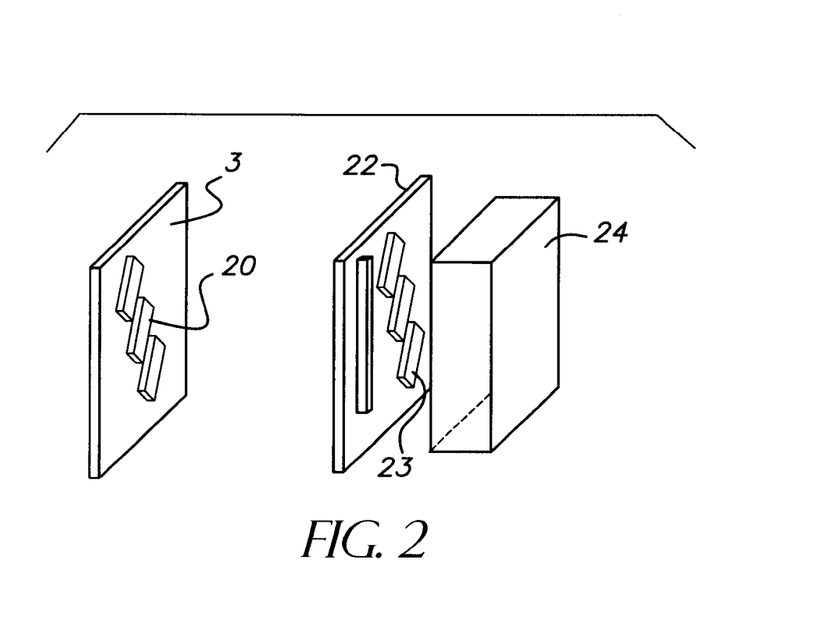
FIG. 2 is a schematic perspective showing components of the alignment detection system.
Figure 3:
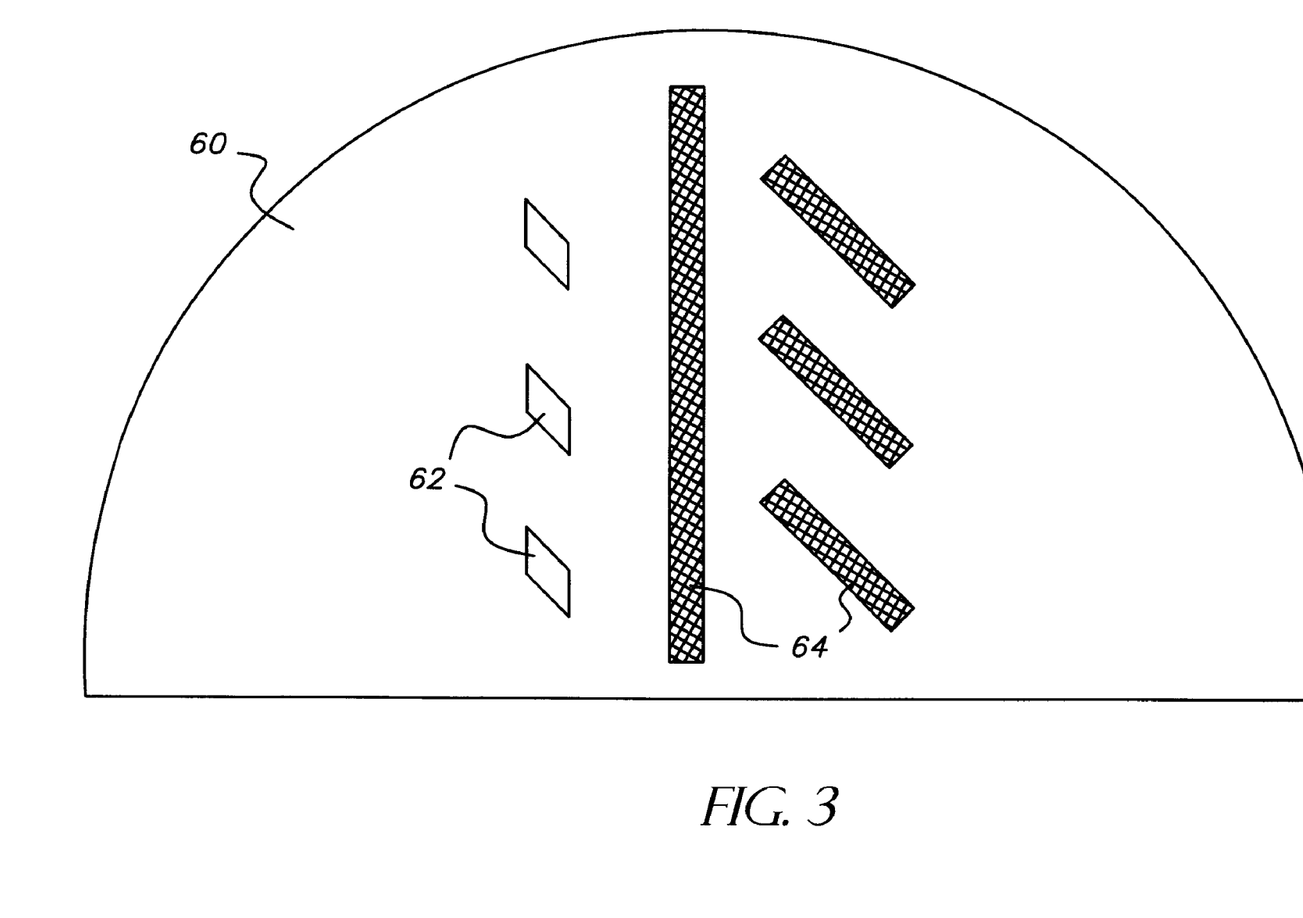
FIG. 3 shows the overlay of the first pattern image with the mask pattern.

FIG. 2 shows the components of the alignment detection system 15. These components include the substrate 3 with first pattern 20, the mask 22, mask pattern 23, photodetector 24. The illumination source and detector electronics are not shown. As either the substrate 3 is moved past the multi-channel laser printhead 1 or the multi-channel laser printhead 1 is moved past the substrate 3, the pattern on the substrate 3 will create a modulation of signal at the detector based upon how the first pattern 20 on the substrate 3 matches with the mask pattern 23. The use of a vertical slit and angled slits in the mask pattern 23 provides the ability to detect both in-scan and cross-scan misalignment. FIG. 3 shows the overlay of the first pattern image 62 with a mask pattern 23 onto a sensor area 60 in a system with no cross-scan errors.

Figure 4:
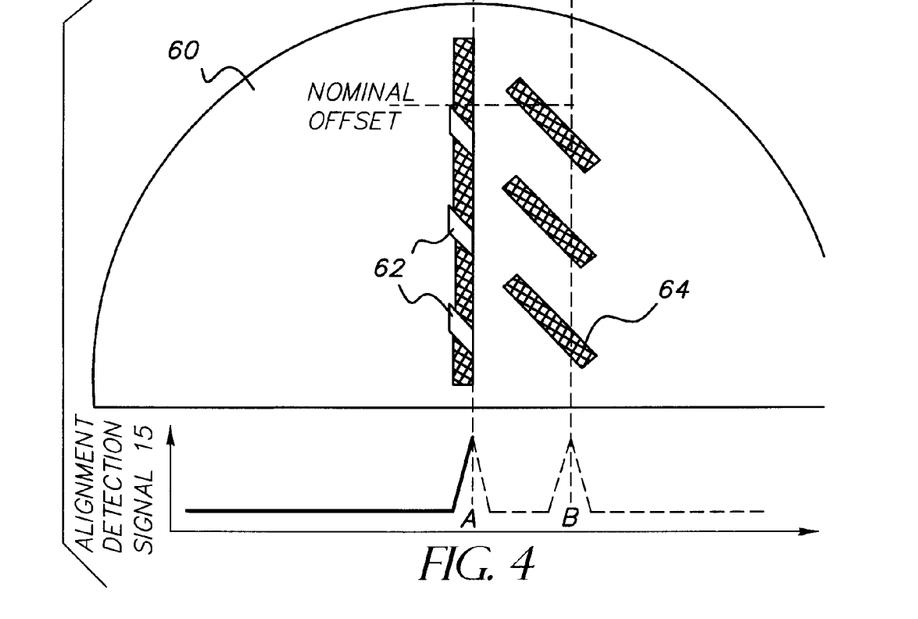
FIG. 4 shows the overlay of the first pattern image and the mask pattern for the nominal case as the first pattern image crosses the vertical portion of the mask pattern.
Figure 5:
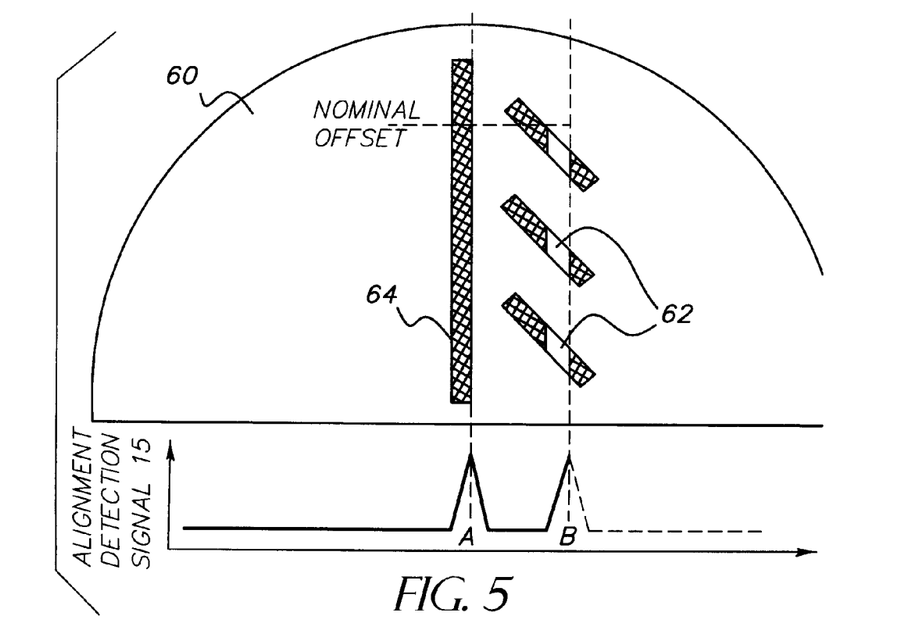
FIG. 5 shows the overlay of the first pattern image and the mask pattern for the nominal case as the first pattern image crosses the slanted portion of the mask pattern.

FIGS. 4 and 5 show the creation of the alignment detection output signal 11 for this system with no cross-scan error, also known as a nominal case system. In FIG. 4, the first pattern image 62 has just fully intersected with the mask pattern 64, and the waveform shown below the sensor area shows that the alignment detection signal 11 has increased to a peak value and is marked as time A. As shown in FIG. 5, as relative movement occurs between the first pattern image 62 and the mask pattern 64, a second peak in the alignment detection output signal 15 is generated and marked as time B. The amount of time between the occurrences of A and B is indicative of the cross-scan error. It should be clear from these figures that cross-scan error can be characterized in terms of the distance traveled between the two events, A and B.

Figure 6:
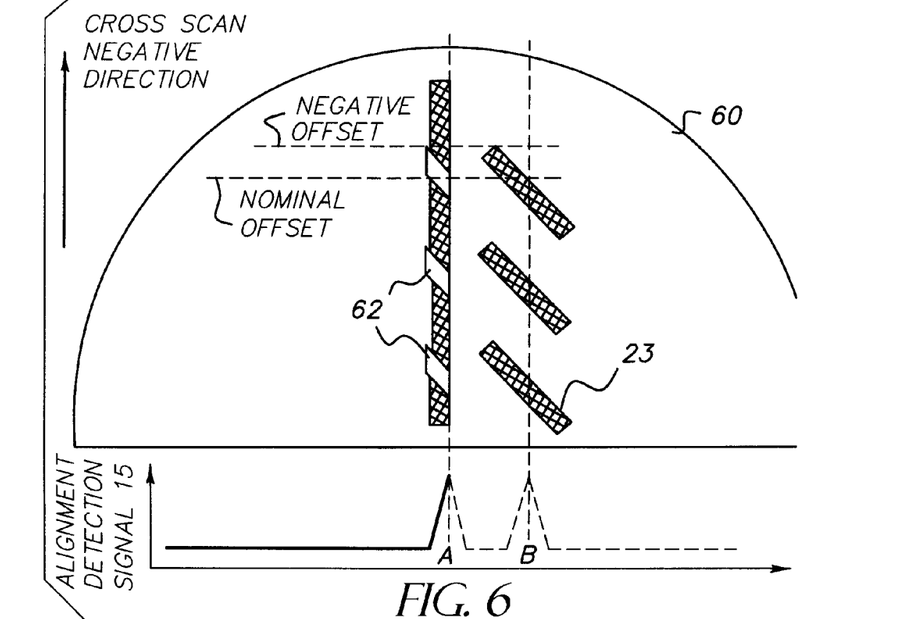
FIG. 6 shows the overlay of the first pattern image and the mask pattern for a negative cross-scan error case as the first pattern image crosses the vertical portion of the mask pattern.
Figure 7:
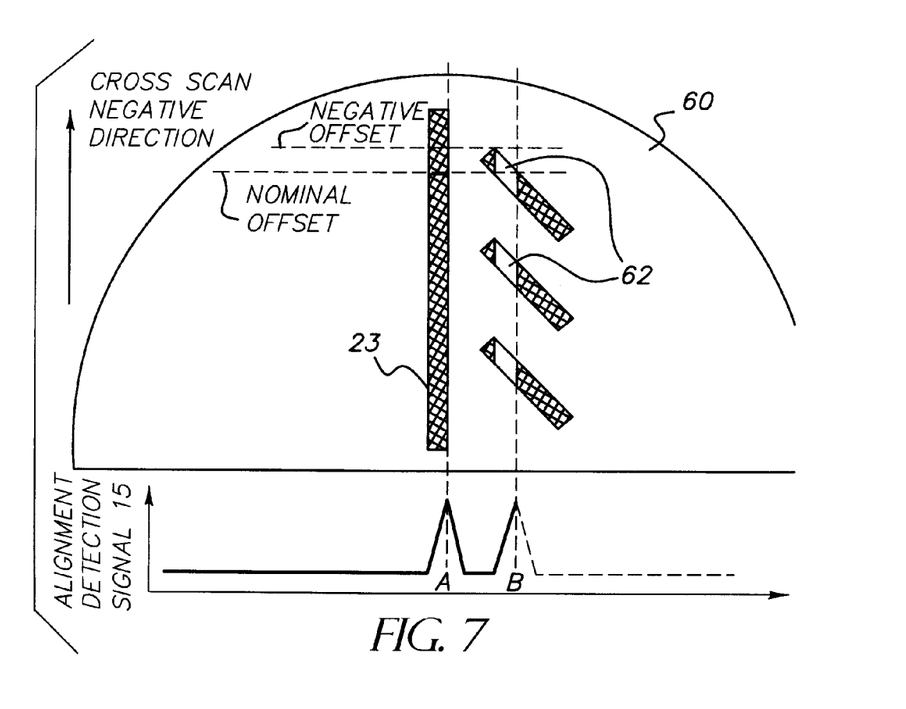
FIG. 7 shows the overlay of the first pattern image and the mask pattern for a negative cross-scan error case as the first pattern image crosses the slanted portion of the mask pattern.
Figure 8:
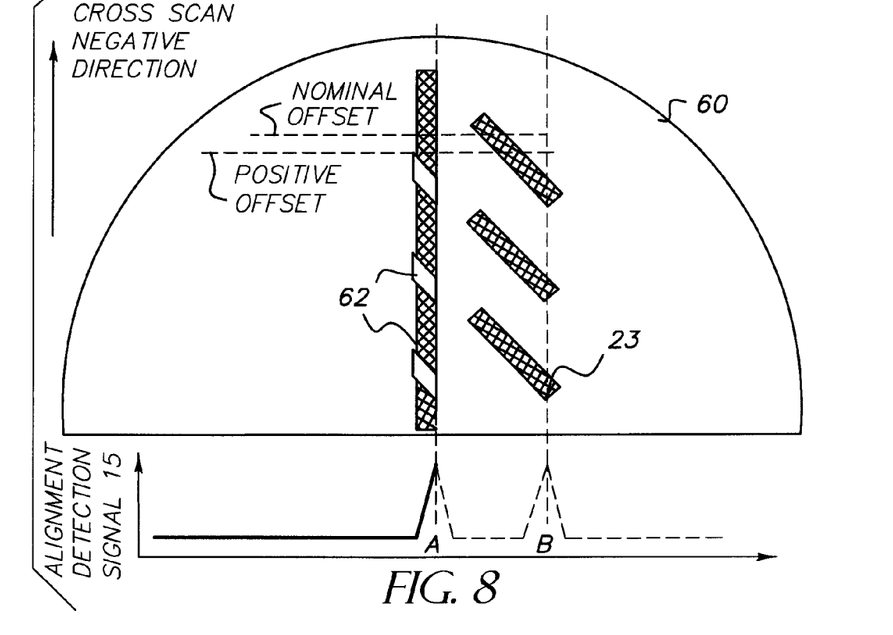
FIG. 8 shows the overlay of the first pattern image and the mask pattern for a positive cross-scan error case as the first pattern image crosses the vertical portion of the mask pattern.
Figure 9:
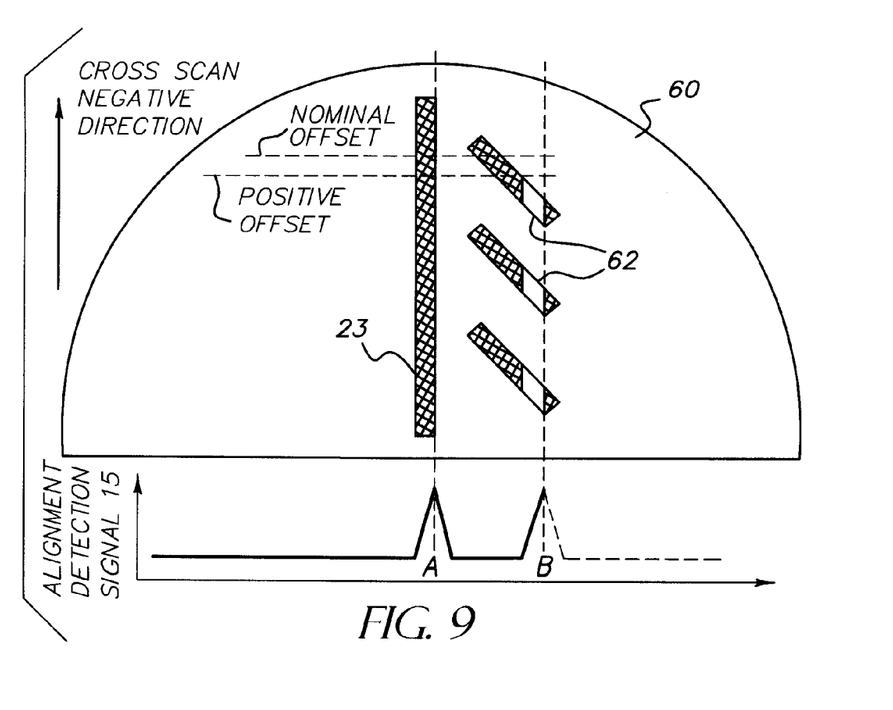
FIG. 9 shows the overlay of the first pattern image and the mask pattern for a positive cross-scan error case as the first pattern image crosses the slanted portion of the mask pattern.
Figure 10:
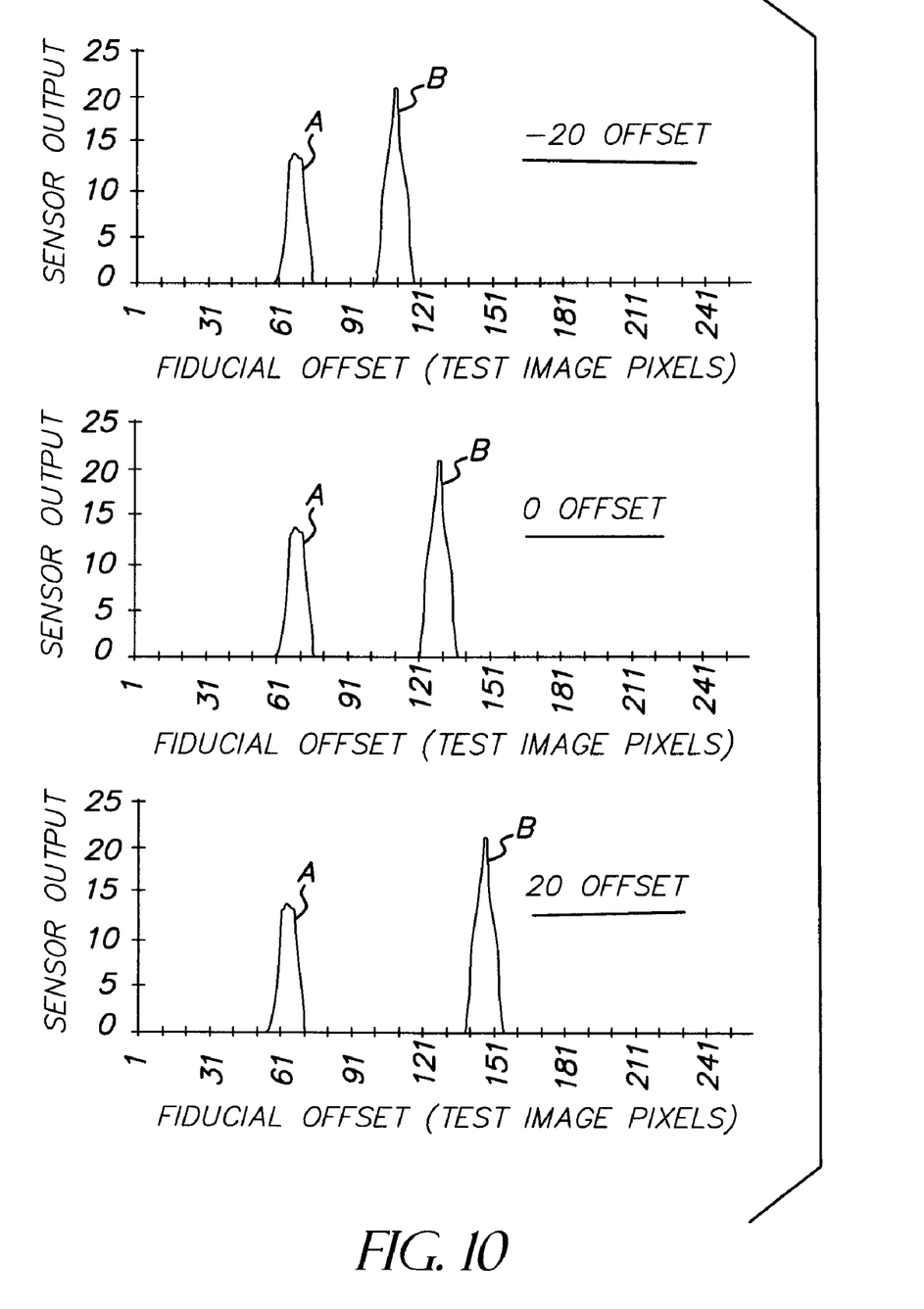
FIG. 10 shows examples of the alignment detection output signal with varying cross-scan offsets.

In a similar manner, FIGS. 6 and 7 illustrate the generation of the alignment detection signal 11 for a system with a negative cross-scan error. FIGS. 8 and 9 illustrate the generation of the alignment detection signal 11 for a system with a positive cross-scan error. FIG. 10 shows representative timing differences for a system with negative, nominal, and positive cross-scan errors.

Figure 11:
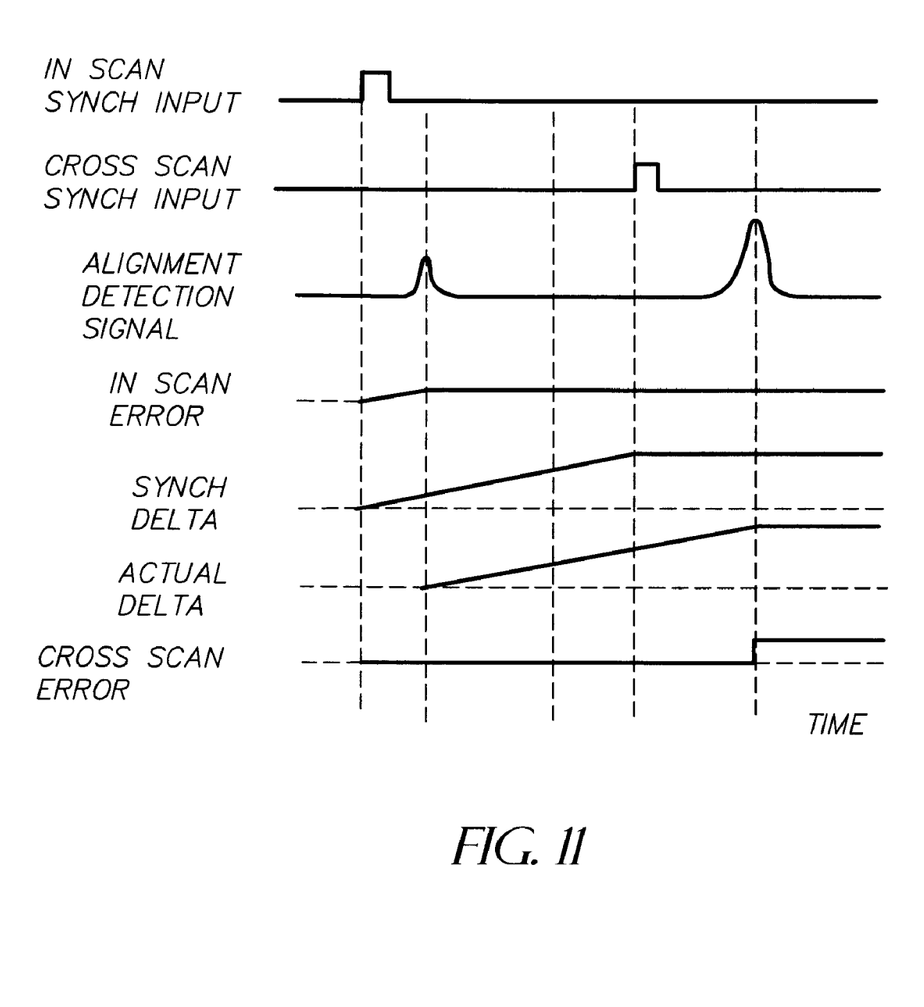
FIG. 11 shows details of a simplified signal processing.

Details of simplified signal processing are shown in FIG. 11. This figure shows the in-scan and cross-scan synch inputs sent by the image data path 5. The third input is the alignment detection signal 11. The location of the first maximum A of the alignment detection signal 15 is measured with respect to the location of the in-scan synch pulse generated by the image data path 5. The positional difference between these two points is the in-scan error. The positional difference from the in-scan synch pulse and the cross-scan synch pulse indicates the predicted time or distance needed to traverse from the first pulse to the second pulse on the alignment detection signal 11. This is called the synch delta. As cross-scan error increases, the time or distance required to reach the actual second maximum on the alignment detector output is increased, as shown in FIG. 10. Capturing the elapsed time or distance from the first maximum A to the second maximum B is the actual delta. The cross-scan error signal is the difference between the synch delta minus the actual delta. In this embodiment the laser light is 808 nm and the modulator is a TIR transmissive device.

The material coated onto the substrate 3, meant to act as a resist, is laser ablative resist that is sensitive to the IR. The channel size is 5 microns and the exposed line widths and gaps that can be produced are as small as 2 microns. Systems that operate in the UV would utilize a UV source and a diffractive modulator and would be capable of smaller channel sizes and feature sizes. The detection system would utilize a sensing beam generated by a laser source at a wavelength different from that of the writing beam.

It should be noted that this embodiment has been described as part of a maskless lithographic system. However, the ability to detect and dynamically compensate for misalignments between a current and first pattern may be applied to many other areas, which require precision alignment of patterns.

In a further embodiment, the alignment detection system 15 can be a camera and high-speed image processing which performs image matching with the expected image region. In such a system the sensing illumination would be diffuse lighting at a range of wavelengths that differ substantially from that of the writing beam. The camera and high-speed image processing is advantaged in that it would enable the determination of rotation.

There is an optical design challenge associated with passing writing wavelengths and different sensing wavelengths for a detection system. One means of working around the optical issues associated with designing an optical system, which transmits writing light at 808 nm and sensing light at a different wavelength, is to place the sensing subsystem outside of the writing path. The drawback associated with this alternative is that the sensing optical path is physically displaced from the writing path. There is no direct link between the two paths, other than precision physical mounting. Physical shifts between the two paths would need to be calibrated on a regular basis in order to ensure that the two were sufficiently linked. Further, the sensing system could not function as part of a closed loop system, whereby it would detect the changes made by the optical element and thus enable low steady state error. One means of linking the two systems is to include use of one channel or an additional channel associated with the multi-channel laser printhead as a pointer, which instructs the sensing system where the writing beam has been directed. This pointer would be used by the sensing system to establish the physical relationship between the writing and sensing systems. Use of an additional channel at the same wavelength as the writing beam is possible as long as the energy in this beam is below patterning threshold. Or alternately, the process of connecting the sensing system with that of the writing system will need to occur in a non-imaging area of the substrate. If, however, an additional channel is provided that is of a non-patterning wavelength, then the linkage between the camera and the multi channel laser printhead 1 can occur continuously. Use of a different wavelength avoids the risk of patterning artifacts, but requires a more complex optical design.

Figure 12:
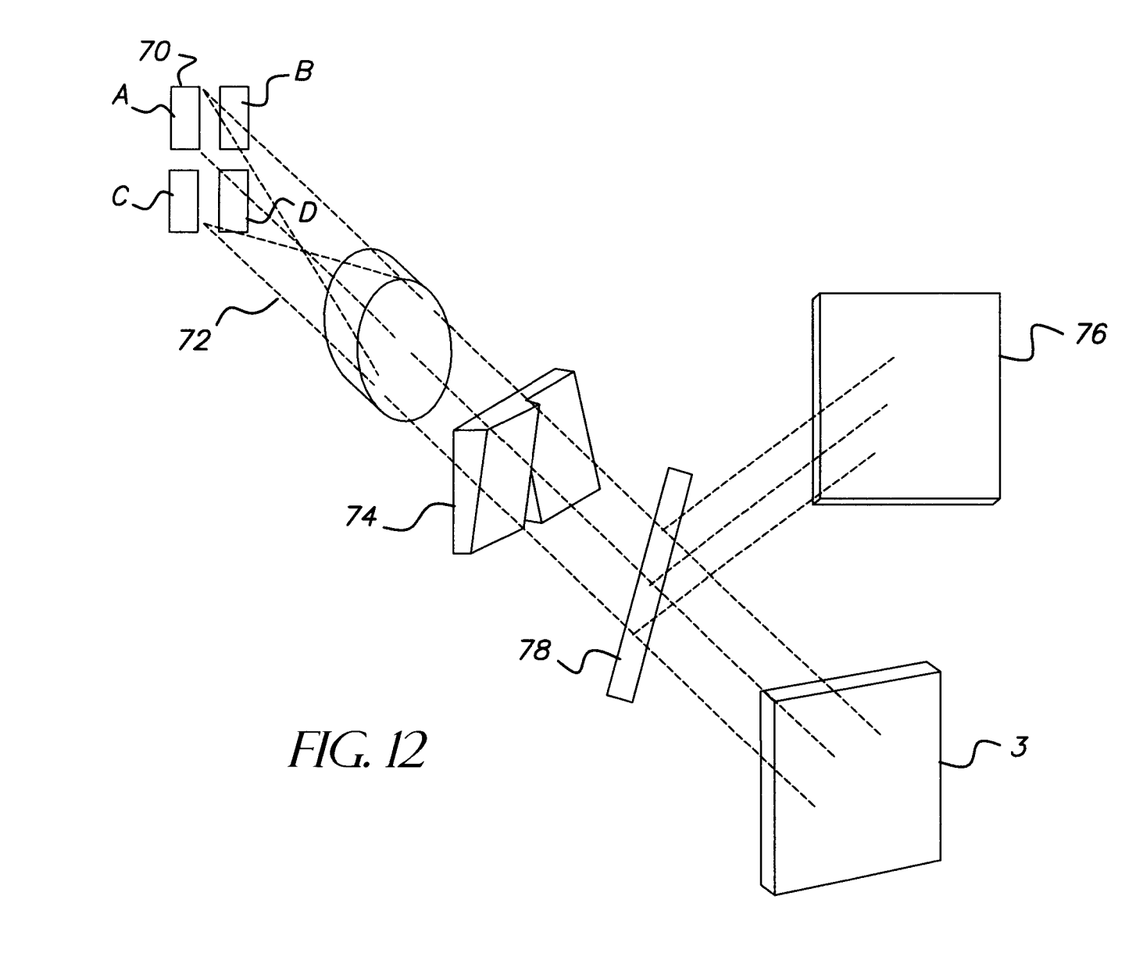
FIG. 12 shows a block diagram of the dual split half aperture auto focus system
Figure 13:
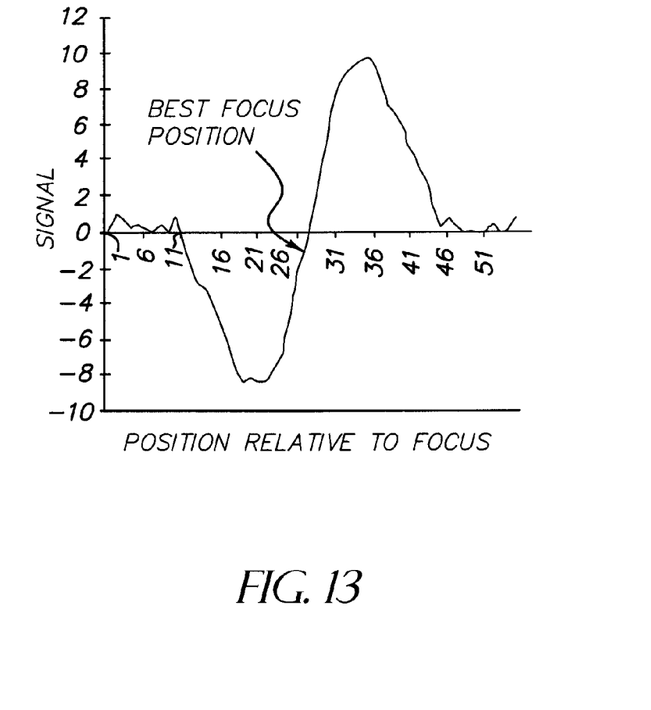
FIG. 13 shows a typical auto focus feedback signal
Figure 14:
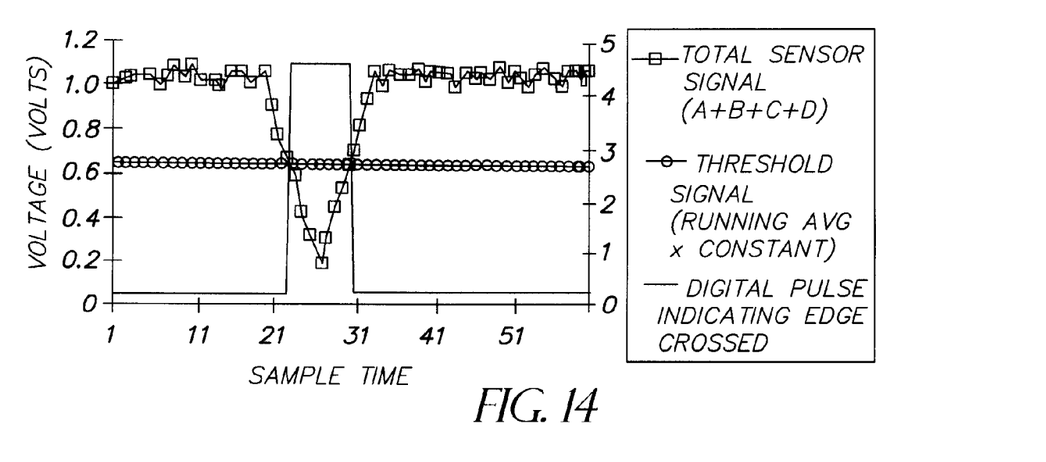
FIG. 14 shows an auto focus feedback signal in response to an edge.
Figure 15:
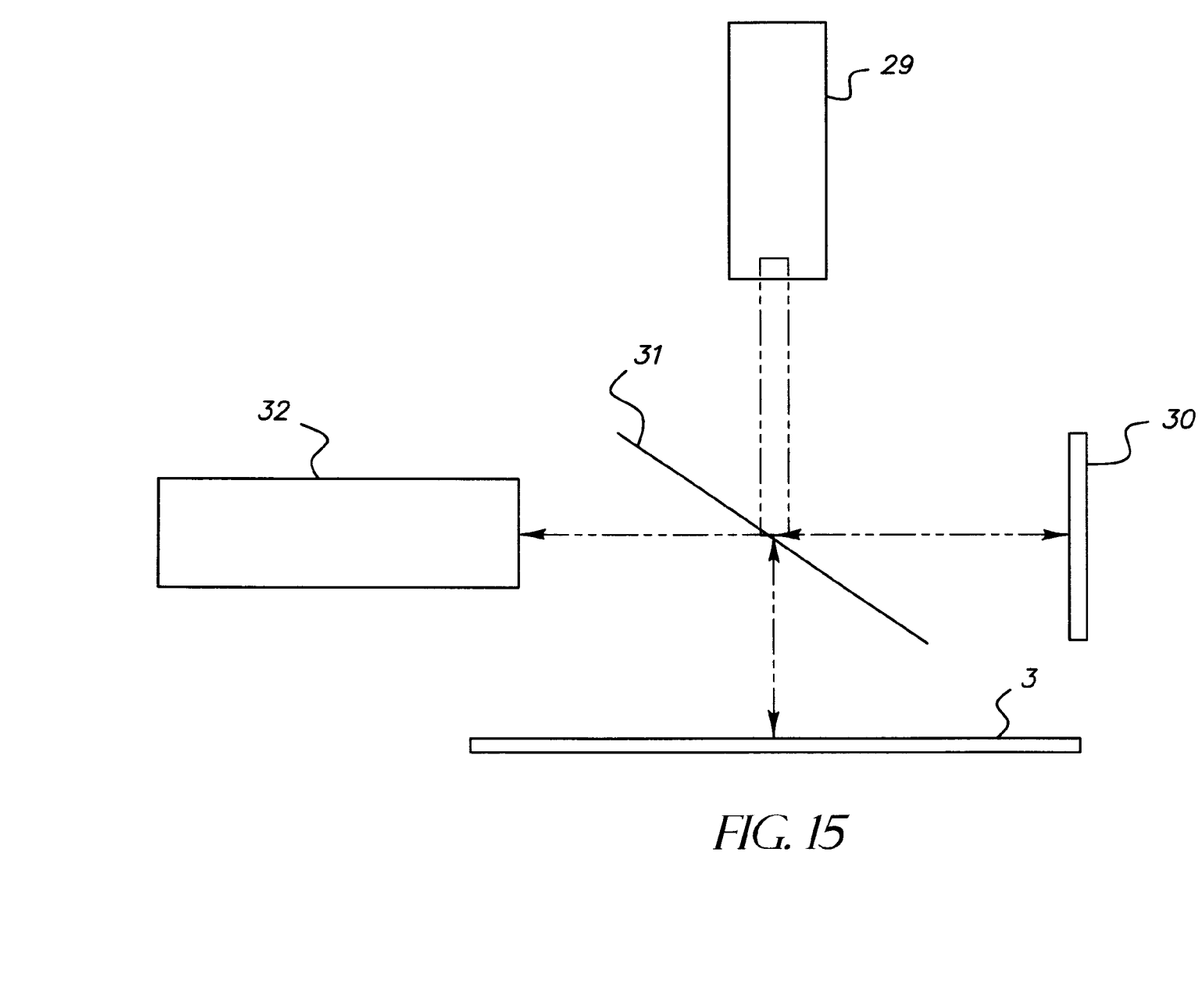
FIG. 15 shows a block diagram or a pictorial representation of an interferometer system.

In a still further embodiment, a pure edge detection scheme may be employed, utilizing coherent illumination that is focused to a small spot. Such an arrangement is similar to that of typical the auto-focus systems. One such system shown in FIG. 12. Typical auto focus detection systems utilizing the dual half aperture approach will provide an analog signal proportional to the height of the reflecting surface. In this system, a laser source 76 sends light to the surface of the substrate 3 through a beam splitter 78. The light reflected from the surface of the substrate 3, passes through the beam splitter 78 and continues through the dual wedges 74 and optics 72, to impinge upon a quad photodetector 70. The dual half aperture focus error detection method creates a differential signal by utilizing both halves of the optical aperture for focus detection. Each half of the optical aperture is sent to either the upper or lower bi-cell of photodetector 70 through the dual wedges 74 that refract one side high and one side low. When the substrate is moved in or out from the best focus position, the spot formed on the two bi-cells that form photodetector 70, change in equal and opposite directions. Adding the signals from the two opposing sides of each bi-cell produces a signal that is twice that of the half aperture approach. By taking the difference of the sum of the other two opposing sides of the bi-cells any common noise that is riding on the signals from all the cells is removed. The result is a cleaner signal that more closely represents the true error signal for focus. The difference signal is typically normalized for consistency. The design for such a system has been described in U.S. Pat. No. 5,406,541 (Kay). Such a detector signal would appear as shown in FIG. 13. The individual intensity of the sensors in an auto focus system such as that in FIG. 12 can also be monitored for changes that would indicate an edge has scattered light. FIG. 14 shows the signals generated in response to passing over an edge. In this embodiment, a distinct pulse would be generated when the small spot traversed a change in elevation on the substrate. This functions effectively as an edge detection system. In a still further embodiment, an interferometer can be used to detect changes in topology as the multi-channel laser printhead 1 with interferometer is scanned along the patterned layer surface. This system is depicted in FIG. 15. In this system, coherent light is directed to the patterned layer from a laser source 29. Part of the illumination passes through a beam splitter 31 and impinges upon a substrate 3. The rest of the illumination is deflected to a mirror 30. The reflected light from both the mirror 30 and the substrate 3 is directed to the sensor 32. The sensor 32 receives this combined light energy which creates an interference pattern. This interference pattern is detected by the sensor 32, which is typically a photo-detector or a CCD.

Figure 16:
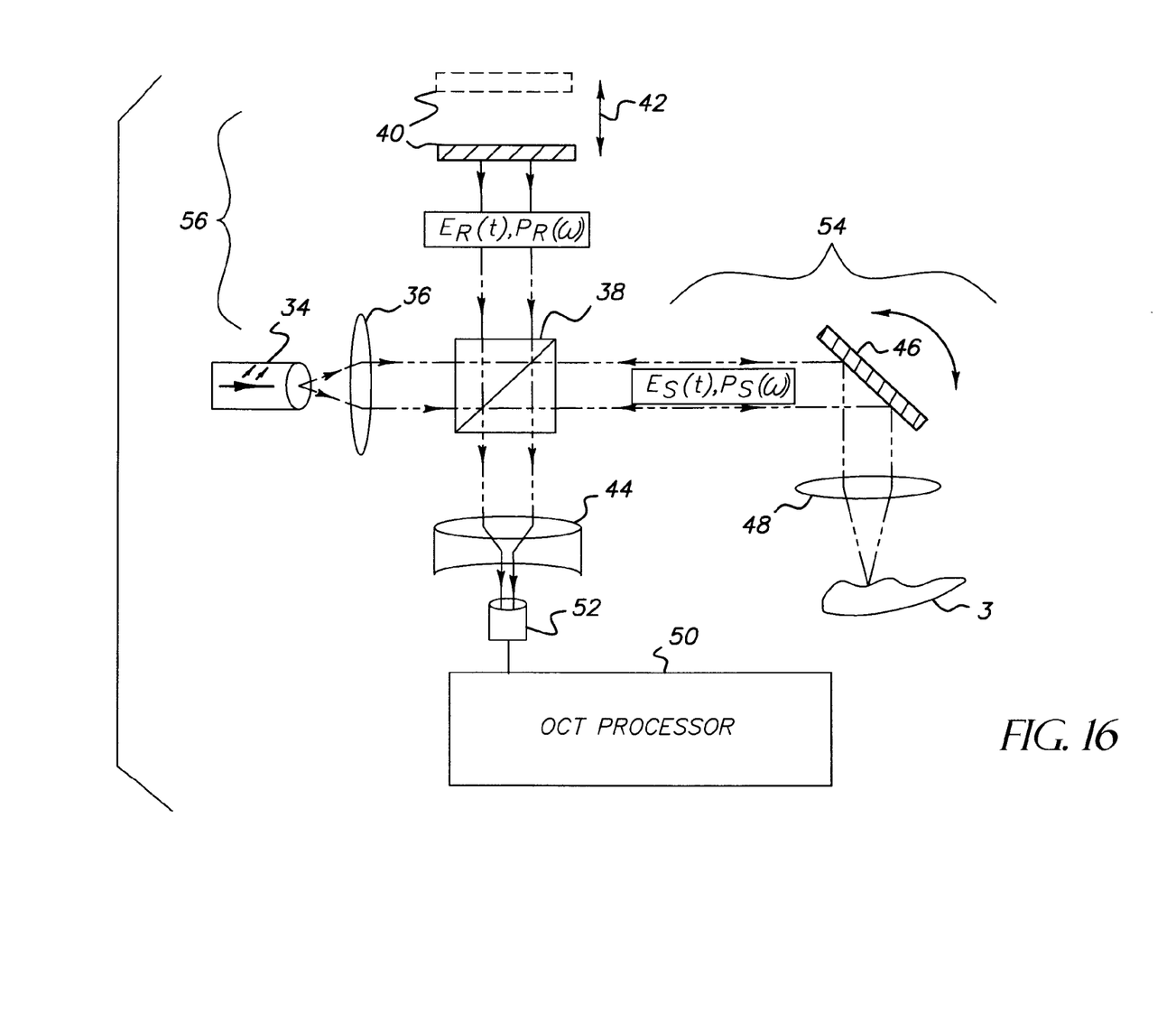
FIG. 16 shows a block diagram or a pictorial representation of an optical coherence tomography system.

In a still further embodiment, optical coherence tomography (OCT) or low coherence interferometry, is a form of interferometry that is used to detect surface topology. A basic system diagram is depicted in FIG. 16. In optical coherence tomography (OCT) a low coherence light source 34 for the interferometer has a short coherence length. Examples of low coherence light sources include super luminescent diodes, lasers with extremely short pulses on the order of femtoseconds and also white light sources. The system includes two arms, a sample arm 54 which includes the substrate 3. The second arm is a reference arm 56, which includes a reference mirror 40. The light from the low coherence source 34 is collimated by a collimation lens 36 and is directed to the two arms by a beam splitter 38. The reflected beams are combined at the beam splitter 38, acted upon by beam reducer 44 and impinge upon a photodetector 52. Photodetector 52 detects a fluctuating signal that is the result of the interference of the two beams that is directly related to the surface topology of the substrate 3. Interference only occurs when the mirror 42 in the reference arm is in a specific axial position. Scanning mirror 46 scans the substrate through the objective lens 48. If the position of the reference arm mirror is closely monitored then a signal can be generated when the axial position of the mirror indicates a specific surface change (within the region of interest).

Figure 17:
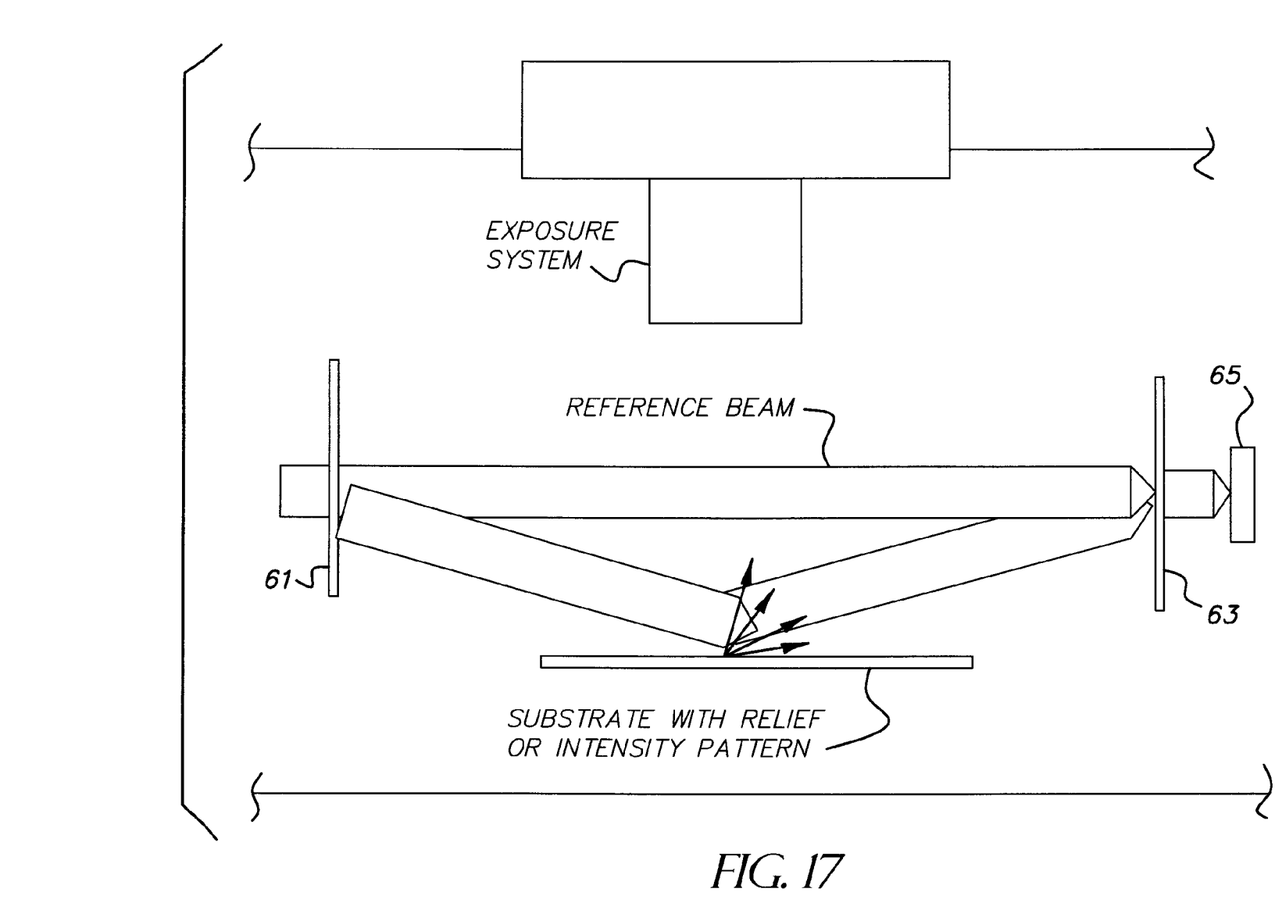
FIG. 17 shows a pictorial representation of a grazing incidence interferometric system.

Grazing incidence interferometry can also be used for detection of surface topographies. FIG. 17 shows a laser beam from laser source impinging on holographic diffraction grating 61 and creating two beams of roughly equal intensity. The first order beam is separated from the zero order beam by a low angle. The first order beam grazes off of substrate 3 at a shallow angle and some of the light reflects and diffracts. The light that combines with the reference beam at the second holographic grating 63 will form an interference pattern containing the image of the relief pattern from the substrate 3. A sensor/video camera 65 can detect the pattern.

In a still further embodiment, this invention is suited for adaptive control application. Since it is possible to detect patterns just after they have been created, the system could employ two detectors; one to aid in locating the pattern point and one to inspect the pattern that has been created. Data can be stored from the second detection system that can be used to enhance the next detection process. It can also be used to better calibrate the correction provided by the first sensor and correction system. It can also be used as in process inspection.

In a still further embodiment, the control algorithms employed by the image data path 5, limit the rate of change of the in-scan control and cross-scan control signal 28. Such a rate limiting control algorithm is often referred to as servo loop. This limitation on the rate of change of the control signals is used to prevent undesirable patterning artifacts.

In a still further embodiment, the control algorithms employed by the image data path, does not limit the rate of change of the in-scan cross-scan control signal 28. This type of control is appropriate where abrupt resynchronization is preferred.

In a still further embodiment, the control algorithms employed may be either rate limiting or non-limiting or a combination thereof. The image data path 5 utilizes process information 8 to determine an adaptive control algorithm.

In a still further embodiment, the substrate can be illuminated with an incoherent source of light and have the image of the substrate projected onto a detector. If the layers on the substrate have sufficient contrast between them then the features in the layers can be discriminated within the image. The detector could be an area array, line sensor, or single sensor.

The invention has been described in detail with particular reference to certain preferred embodiments thereof, but it will be understood that variations and modifications can be effected within the scope of the invention.

PARTS LIST 1 multi-channel laser printhead
2 patterns of light
3 substrate
4 sensitive materials
5 image data path
7 motion control system
8 process information
9 modulator driver electronics
10 modulator
11 alignment detection output signal
12 cross-scan correction controller
13 optical element
14 current region
15 alignment detection system
16 image data
18 drive signals
20 first pattern
21 support
22 mask
23 mask pattern
24 photodetector
26 current motion control system position
28 cross-scan control signal
29 laser source
30 mirror
31 beam splitter
32 sensor
34 low coherence light source
36 collimation lens
38 beam splitter
40 reference mirror
42 axial scanning direction
44 beam reducer
46 scanning mirror
48 objective lens
50 optical computed tomography (OCT) processor
52 photodetector
54 sample arm
56 reference arm
58 sensing and detecting beam
60 sensor area
61 first holographic diffraction grating
62 first pattern image
63 second holographic diffraction grating
64 mask pattern
65 video camera
70 photodetector
72 optics
74 dual wedges
76 laser source
78 beam splitter

The invention claimed is:

1. A method for dynamically registering multiple patterned layers on a substrate comprising:
   a) forming a first pattern on said substrate;
   b) forming a second pattern on said first pattern wherein said second pattern has associated image data, comprising providing said associated image data to an image data path which is in communication with a gating means and a cross-scan controller, wherein said image data path forms said second pattern by:
      i) obtaining expected feature location information for a first current region;
      ii) detecting the location of features in said first current region of said substrate having a first portion of said first pattern;
      iii) calculating an alignment correction signal from said detected location of the features of ii) and said expected location information in i);
      iv) applying said alignment correction signal to said gating means or said cross-scan controller in order to adjust the application of said associated image data in said first current region; and
      v) repeating steps i) and ii) until said second pattern is complete and is aligned with said first pattern.

2. A method as in claim 1 wherein a first layer is deposited on said substrate prior to forming said first pattern.

3. A method as in claim 1 wherein said detection is optical.

4. A method as in claim 3 wherein said optical detection is accomplished by a sensor selected from a group comprising a photodiode with a mask, a linear array, or an area array.

5. A method as in claim 4 wherein said photodiode is a bi-cell or quad cell or lateral effect photodiode.

6. A method as in claim 3 wherein said optical detection comprises:
   illuminating said substrate; and
   detecting reflections due to said first pattern.

7. A method as in claim 6 wherein said illumination is accomplished by a source selected from a group comprising coherent sources and incoherent sources.

8. A method as in claim 6 wherein said illumination and optical detection comprises:
   illuminating said substrate with a coherent source; and
   detecting the reflected beam deflections due to said first pattern.

9. A method as in claim 6 wherein said illumination and optical detection comprises:
   illuminating said substrate with a coherent source; and
   detecting changes in coherence due to said first pattern.

10. A method as in claim 6 wherein said illumination and optical detection comprises:
    illuminating said substrate with an incoherent source; and
    detecting the differences in reflectivity of said substrate and said first pattern.

11. A method in claim 6 wherein said illumination and optical detection comprises:
    illuminating said substrate with a coherent source; and detection of interference patterns created by a combination of the outgoing beam and reflected beam.

12. A method as in claim 1 wherein said detection step occurs within a capture window.

13. A method as in claim 12 wherein said capture window is predefined.

14. A method as in claim 12 wherein said capture window is detected by recognizing an optically detected signature due to said first pattern.

15. The method of claim 1 wherein said substrate further comprises at least one pre-existing pattern, and wherein the step of detecting the location of features includes detecting features in either said first pattern or in said at least one pre-existing pattern.

16. The method of claim 1 wherein said cross-scan controller controls an optical element.

17. A method as in claim 3 where the optical detection comprises a process control system for monitoring for defects, and adjusting calibration of X and Y detection and correction systems, and adjusting characteristics associated with said first pattern comprising addition of at least one additional illumination source and at least one additional detector and signal processing unit.

18. A method as in claim 3 wherein said optical detection comprises:

illuminating said substrate with a source having an optical path that is physically separate from a writing beam optical path.

19. A method as in claim 1 wherein a second layer is deposited on said substrate prior to forming said second pattern.

20. A method for dynamically registering multiple patterned layers on a substrate comprising:

forming a first pattern on a first layer;

depositing a second layer on said first pattern;

illuminating said second layer;

dynamically detecting reflections from said first pattern to align a second pattern to said first pattern; and forming said second pattern on said second layer.

21. A method as in claim 20 further comprising:

adjusting wavelength or magnitude illumination to optimize detection based on layer or pattern characteristics.

22. A method as in claim 20:

wherein a write head forms said second pattern; and wherein write head characteristics are adjusted based on said dynamic detection.

* * * * *